United States Patent

Lin

[19]

[11] Patent Number: 6,095,842
[45] Date of Patent: Aug. 1, 2000

[54] CONTACT WITH DUAL COMPLIANT PIN SECTIONS USED IN A ZIF SOCKET

[75] Inventor: Nick Lin, Hsin-Chuang, Taiwan

[73] Assignee: Hon Hai Precision Ind. Co., Ltd., Taipei Hsien, Taiwan

[21] Appl. No.: 09/295,478

[22] Filed: Apr. 19, 1999

[51] Int. Cl.[7] ............................................. H01R 4/50
[52] U.S. Cl. ............................ 439/342; 439/856; 439/83
[58] Field of Search ........................... 439/83, 342, 856, 439/857, 862

[56] References Cited

U.S. PATENT DOCUMENTS

| | | | |
|---|---|---|---|
| 4,498,725 | 2/1985 | Bright et al. | 439/342 |
| 5,741,144 | 4/1998 | Elco et al. | 439/101 |
| 5,876,219 | 3/1999 | Taylor et al. | 439/74 |
| 5,989,049 | 11/1999 | Walkup et al. | 439/342 |

*Primary Examiner*—Khiem Nguyen
*Attorney, Agent, or Firm*—Wei Te Chung

[57] ABSTRACT

A contact for use in a ZIF socket comprises an engagement portion for firmly fixing the contact in the socket. A cutout is formed in a lower intermediate of the engagement portion. A first compliant pin section extends upward from an upper edge of the engagement portion. A second compliant pin section extends downward from an inner upper wall of the cutout thus separating the cutout into two space portions. An end of the second compliant pin section is allowed to be attached with an external solder ball. A contacting portion extends from the first compliant pin section and has a straight plate substantially coplanar with the engagement portion, a curved plate extending from the straight plate and a movable contacting plate extending from the curved plate and spaced away from and opposite to the straight plate.

11 Claims, 3 Drawing Sheets

… … …

CONTACT WITH DUAL COMPLIANT PIN SECTIONS USED IN A ZIF SOCKET

BACKGROUND OF THE INVENTION

1. Field of the Invention

The present invention relates to a contact with dual compliant pin sections used in an electrical connector, especially a contact having dual compliant pin sections used in a zero insertion force socket on which a CPU module is mounted.

2. The Prior Art

An electrical connector especially a zero insertion force (ZIF) socket has been used to connect a CPU to a printed circuit board for years. Normally, this socket needs a relatively long pitch for adopting a lead-in distance of each contact which allows a corresponding CPU pin to be inserted into the socket with substantially zero insertion force firstly and then moved by a cover of the socket for this lead-in distance to abut against contacting portion of the contact in the socket. These sockets may be referred to U.S. Pat. Nos. 5,057,031 and 5,730,615. However, the contacts of the above patents if directly used in a ball grid array soldering process will cause some problems during the soldering process or during later operation. One of the serious problems is the damage to the soldering ball due to frequent on-off of the CPU which causes fatigue of the solder ball because of long term of temperature variation due to frequent on/off of the CPU.

Another serious problem is that coefficients of thermal expansion between the socket and the printed circuit board are different during soldering (at a very high temperature) thereby resulting in tension in the solder ball. This tension if not released will damage the solder ball thus negatively affecting the normal conducting between the socket and the printed circuit board.

For solving these problems, it is requisite to provide a new contact which has a compliant pin section to efficiently absorb the unwanted tension occurred or stored in the solder ball.

Although the inventor of this application has applied a U.S. patent application Ser. No. 09/146,998 relating to a low profile socket and the contacts thereof, he does not particularly point out this problem in that application and no claims related to the compliant pin section of the contact. Moreover, the contact as disclosed in U.S. patent application Ser. No. 09/146,998 does not have an additional compliant pin section which can guarantee the CPU pin be stably and properly engaged between two contacting sections of the contact thereof. For example, sometimes the CPU pin may be in contact with one of the contacting portions tightly while in contact with the other contacting portion loosely, thus causing unstable contacting and resulting in unstable impedance. Therefore, this application is focused on the dual compliant pin sections of the contact which is distinguished from the U.S. patent application Ser. No. 09/146,998.

SUMMARY OF THE INVENTION

The primary purpose of the present invention is to provide an improved contact having dual compliant pin sections for effectively absorbing fatigue due to temperature variation during a long term use of the related socket or for absorbing tension due to different coefficients of thermal expansion between the socket and a printed circuit board on which the socket is mounted during a soldering process.

In accordance with one aspect of the present invention, a contact for use in a ZIF socket comprising an engagement portion for firmly fixed the contact in the socket and having a cutout formed in a lower intermediate thereof. A first compliant pin section extends upward from an upper edge of the engagement portion. A second compliant pin section extends downward from an inner upper wall of the cutout thus separating the cutout into two space portions and at least one portion of the second compliant pin section is vertically in alignment with at least one portion of the first compliant pin section. An end of the second compliant pin section is allowed to be attached with an external solder ball. A contacting portion extends from the first compliant pin section and has a straight plate substantially coplanar with the engagement portion, a curved plate extending from the straight plate and a movable contacting plate extending from the curved plate and spaced away from and opposite to the straight plate.

In accordance with another aspect of the present invention, a contact for use in a ZIF socket comprising an open loop portion having a curved portion, a first end contacting portion and a second end contacting portion respectively extending from two ends of the curved portion and spaced from and confronting to each other, wherein a space defined in the open loop portion is converged from an inner most portion of the curved portion to an opening which spaces the first end contacting portion and the second end contacting portion. A first compliant pin section extends downward from the first end contacting portion. An elongated engagement portion is connected to the first compliant pin section and a longitudinal direction thereof is substantially perpendicular to an extended direction of the first compliant pin section, wherein the elongated engagement portion has an intermediate narrower portion. A second compliant pin section extends downward from the intermediate narrower portion of the elongated engagement portion and at least one portion of the second compliant pin section is vertically in alignment with at least one portion of the first compliant pin section.

DETAILED DESCRIPTION OF THE PREFERRED EMBODIMENT

Figure 1:
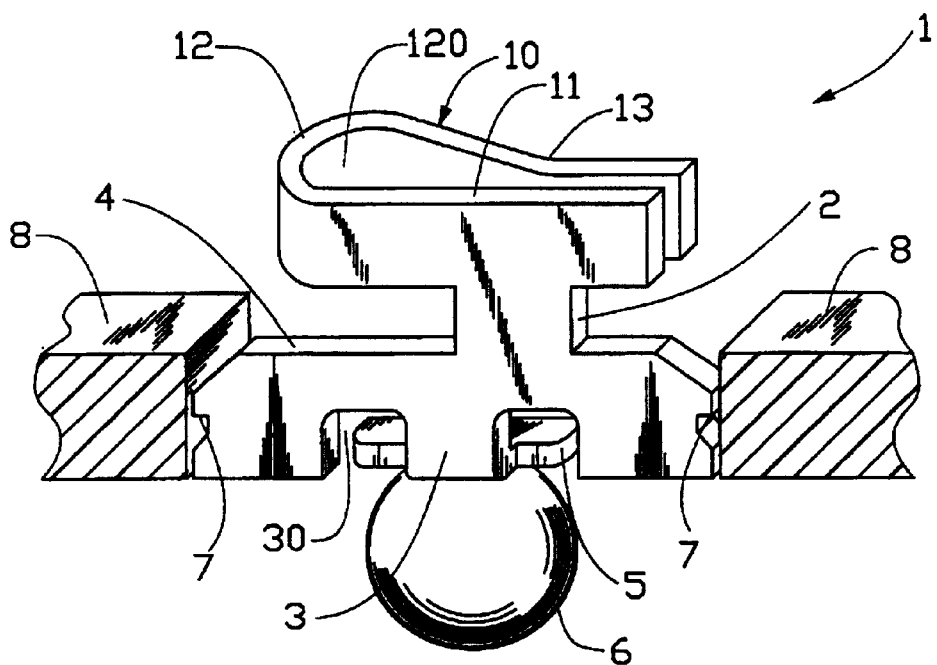
FIG. 1 is a perspective view of a contact in accordance with the present invention.
Figure 2:
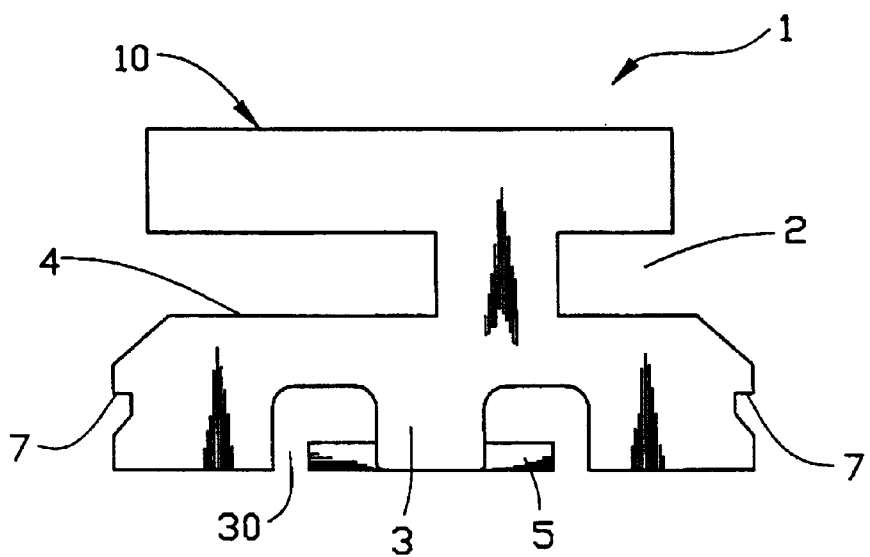
FIG. 2 is a front view of FIG. 1.

Referring to FIGS. 1 and 2, a contact 1 used in a ZIF socket comprises an elongated engagement portion 4 for firmly fixed the contact 1 in the socket and having a cutout 30 formed in a lower intermediate thereof. The engagement portion 4 has barbs 7A formed in two ends thereof for engaging to housing portion 8 of the socket. A first compliant pin section 2 extends upward from an upper edge of the engagement portion 4. A second compliant pin section 3 extends downward from an inner upper wall of the cutout 30 thus separating the cutout 30 into two space portions and at least one portion of the second compliant pin section is vertically in alignment with at least one portion of the first compliant pin section 2. A solder tail 5 extends substantially perpendicular to one end of the second compliant pin section 3 for engaging with a solder ball 6 by a soldering procedure.

The socket is then soldered on a printed circuit board (not shown) via a soldering procedure. Alternatively, the solder tail 5 may be omitted and the solder ball 6 is directly soldered onto an end portion of the second compliant pin section 3.

A contacting portion 10 having an open loop shape extends from the first compliant pin section 2 and having a straight plate 11 substantially coplanar with the engagement portion 4, a curved plate 12 extending from the straight plate 11 thereby defining a reception space 120 therein and a movable contacting plate 13 extending from the curved plate 12 and opposite to and spaced away from the straight plate 11. The barbs 7 of the engagement portion are located in a horizontal level higher than the end of the second compliant pin section 3 while lower than the first compliant pin section 2.

Figure 3:
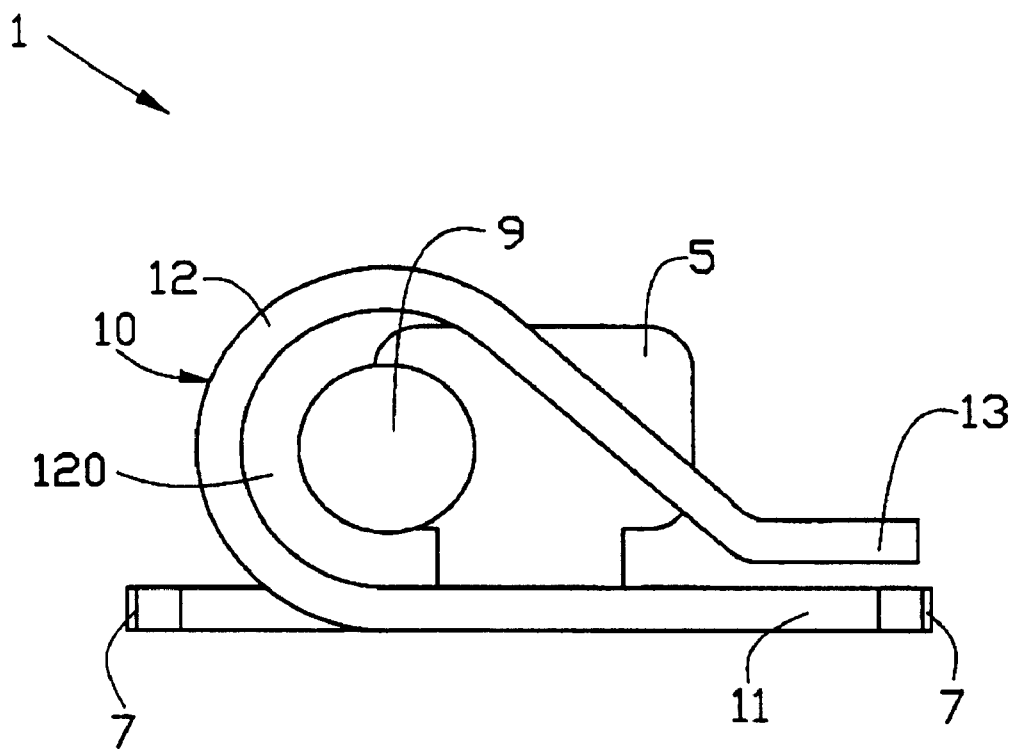
FIG. 3 is a schematic view showing that a CPU pin is inserted into the contact of the present invention with substantially zero insertion force.
Figure 4:
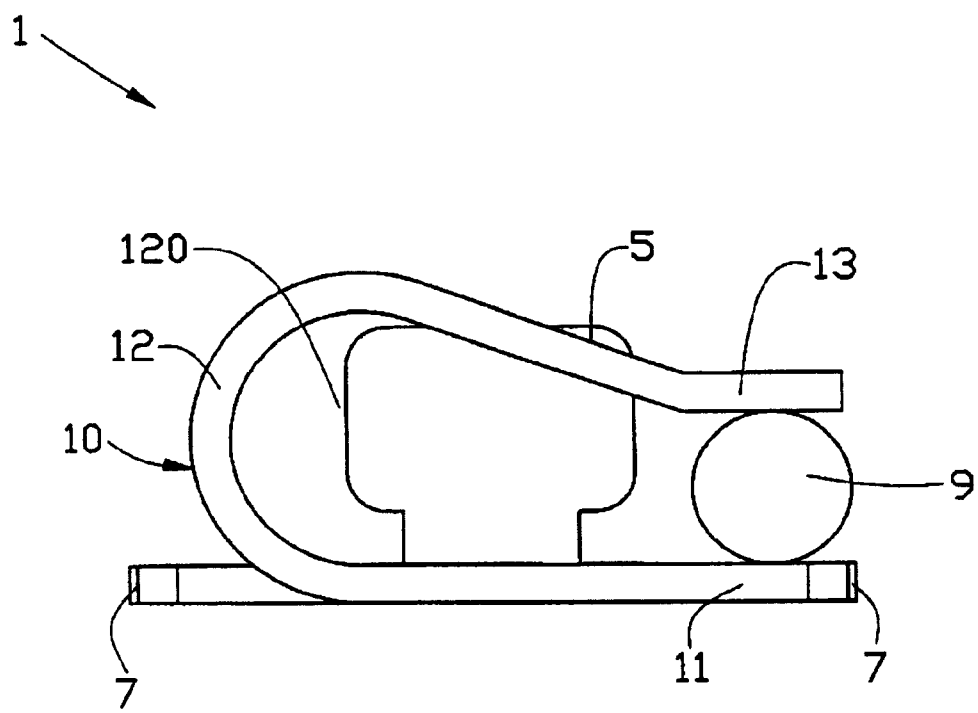
FIG. 4 is another schematic view showing that the CPU pin of FIG. 3 has been moved to be electrically engaged with the contact of the present invention.

Referring to FIG. 3, a CPU pin 9 may be inserted into the contact 1 from the reception space 120 with substantially zero insertion force. Also referring to FIG. 4, the CPU pin 9 may be moved into a narrower space defined between the movable contacting plate 13 and the straight plate 11 and retained in position by the two plates 13 and 11. The first compliant pin section 2 deforms when the CPU pin 9 is moved from the position of FIG. 3 to the position of FIG. 4 in order to guarantee the contacting with both the movable contacting plate 13 and the straight plate 11. When the CPU pin 9 is retained in position by the movable contacting plate 13 and the straight plate 11, an electrical transmission path is defined from the CPU pin 9 via the straight plate 11, the at least one vertical aligned portion of the first compliant pin section 2, a portion of the engagement portion 4, the at least one vertical aligned portion of the second compliant pin section, the solder tail 5 and the solder ball 6. This electrical transmission path is a relatively short path between the CPU pin 9 and the solder ball 6.

Since the contact 1 includes the second compliant pin section 3, internal tension on the solder ball 6 due to difference of coefficients of expansion on the socket and the printed circuit board may be absorbed by deformation of the second compliant pin section 3. Moreover, fatigue due to frequent on/off of the CPU may be considerably eliminated by the deformation on the second compliant pin sections 3 for long term use of the CPU.

It can be noted that the second compliant pin section 3 extends downward from the middle portion of the engagement portion 4 while the first compliant pin section 2 extends upward offset from the second compliant pin section 3 along the vertical direction. The first compliant pin section 2 is away from the curve plate 12 while is generally close to the CPU pin 9 when the CPU pin 9 is retained in position between the contacting plate 13 and the straight plate 11. Due to this offset arrangement, the stress due to different coefficients of expansion on the socket and the printed circuit board also may not straightly or directly impact upon the CPU pin 9, thus assuring a reliable engagement between the contact 1 and the CPU pin 9.

While the present invention has been described with reference to a specific embodiment, the description is illustrative of the invention and is not to be construed as limiting the invention. Therefore, various modifications to the present invention can be made to the preferred embodiment by those skilled in the art without departing from the true spirit and scope of the invention as defined by the appended claims.

What is claimed is:

1. A contact for use in a ZIF socket comprising:
   an elongated engagement portion for firmly fixed the contact in the socket and having a cutout formed in a lower intermediate thereof;
   a first compliant pin section extending upward from an upper edge of the engagement portion;
   a second compliant pin section extending downward from an inner upper wall of the cutout thereby separating the cutout into two space portions and at least one portion of the second compliant pin section being vertically in alignment with at least one portion of the first compliant pin section, wherein an end of the second compliant pin section is allowed to be attached with an external solder ball; and
   a contacting portion extending from the first compliant pin section and having a straight plate substantially coplanar with the engagement portion, a curved plate extending from the straight plate and a movable contacting plate extending from the curved plate and spaced away from and opposite to the straight plate.

2. The contact for use in a ZIF socket as claimed in claim 1, wherein the contacting portion defines a reception space bound by the straight plate, the curved plate, and the movable contacting plate and the reception space converges from a first portion thereof to a second portion which spaces the straight plate and the movable contacting plate.

3. The contact for use in a ZIF socket as claimed in claim 1, wherein the first compliant pin section is relatively narrower than the straight plate and the engagement portion.

4. The contact for use in a ZIF socket as claimed in claim 1, wherein the engagement portion has barbs formed in two ends thereof.

5. The contact for use in a ZIF socket as claimed in claim 1, wherein the second compliant pin section has a solder tail perpendicularly extending from one end thereof.

6. The contact for use in a ZIF socket as claimed in claim 4, wherein the barbs of the engagement portion are located in a horizontal level higher than the end of the second compliant pin section while lower than the first compliant pin section.

7. A contact for use in a ZIF socket comprising:
   an open loop portion having a curved portion, a first end contacting portion and a second end contacting portion respectively extending from two ends of the curved portion and spaced from and confronting to each other, wherein a space defined in the open loop portion is converged from an inner most portion of the curved portion to an opening which spaces the first end contacting portion and the second end contacting portion;
   a first compliant pin section extending downward from the first end contacting portion;
   an elongated engagement portion connected to the first compliant pin section and a longitudinal direction thereof being substantially perpendicular to an extended direction of the first compliant pin section, wherein the elongated engagement portion has an intermediate narrower portion; and
   a second compliant pin section extending downward from the intermediate narrower portion of the elongated engagement portion and at least one portion of the second compliant pin section is vertically in alignment with at least one portion of the first compliant pin section.

8. The contact for use in a ZIF socket as claimed in claim 7, wherein the engagement portion has barbs formed in two ends thereof for engaging with the socket.

9. The contact for use in a ZIF socket as claimed in claim 8, wherein the barbs are located in a level between a lower end of the first compliant pin section and a lower end of the second compliant pin section.

10. The contact for use in a ZIF socket as claimed in claim 9, wherein the second compliant pin section has a solder tail horizontally extending therefrom.

11. A contact for use in a ZIF socket mounted on a PC board, comprising:

an elongated engagement portion with means for retention of the contact within the socket;

a first compliant pin section extending upward from said engagement portion and a second compliant pin section extending downward from said engagement portion;

a contact portion positioned on the first compliant pin section; and a solder tail extending from said second compliant pin section with a solder ball attached thereunder; wherein the second compliant pin section extends downward from a middle portion of the engagement portion while the first compliant pin section extends upward offset from said second compliant pin section along a vertical direction for being closer to a corresponding CPU pin, so that a stress due to different coefficients of expansion on the socket and the PC board will not straightly or directly impact upon the CPU pin.

* * * * *